(12) United States Patent
Kurganova et al.

(10) Patent No.: US 11,947,256 B2
(45) Date of Patent: Apr. 2, 2024

(54) SIMULTANEOUS DOUBLE-SIDE COATING OF MULTILAYER GRAPHENE PELLICLE BY LOCAL THERMAL PROCESSING

(71) Applicant: ASML NETHERLANDS B.V., Veldhoven (NL)

(72) Inventors: Evgenia Kurganova, Nijmegen (NL); Adrianus Johannes Maria Giesbers, Vlijmen (NL); Maxim Aleksandrovich Nasalevich, Eindhoven (NL); Arnoud Willem Notenboom, Rosmalen (NL); Mária Péter, Eindhoven (NL); Pieter-Jan Van Zwol, Eindhoven (NL); David Ferdinand Vles, Eindhoven (NL); Willem-Pieter Voorthuijzen, 's-Hertogenbosch (NL)

(73) Assignee: ASML NETHERLANDS B.V., Veldhoven (NL)

( * ) Notice: Subject to any disclaimer, the term of this patent is extended or adjusted under 35 U.S.C. 154(b) by 283 days.

(21) Appl. No.: 16/634,910

(22) PCT Filed: Jun. 26, 2018

(86) PCT No.: PCT/EP2018/067052
§ 371 (c)(1),
(2) Date: Jan. 29, 2020

(87) PCT Pub. No.: WO2019/025082
PCT Pub. Date: Feb. 7, 2019

(65) Prior Publication Data
US 2020/0159107 A1 May 21, 2020

(30) Foreign Application Priority Data
Aug. 3, 2017 (EP) .................................... 17184701

(51) Int. Cl.
*G03F 1/62* (2012.01)
*C01B 32/186* (2017.01)
*G03F 7/00* (2006.01)

(52) U.S. Cl.
CPC ............. *G03F 1/62* (2013.01); *C01B 32/186* (2017.08); *G03F 7/70958* (2013.01); *G03F 7/70983* (2013.01)

(58) Field of Classification Search
CPC ..... G03F 1/62; G03F 1/38; G03F 1/22; G03F 1/24; G03F 1/64; G03F 7/70958;
(Continued)

(56) References Cited

U.S. PATENT DOCUMENTS 5,624,722 A * 4/1997 Nagaishi ............... C23C 14/087
427/586
6,057,271 A * 5/2000 Kenjiro ................ H10N 60/203
505/475
(Continued)

FOREIGN PATENT DOCUMENTS

JP 1995252662 10/1995
JP H07252662 10/1995
(Continued)

OTHER PUBLICATIONS

English translation of WO2012/049428, published Apr. 19, 2012. (Year: 2012).*
(Continued)

*Primary Examiner* — Christina A Riddle
(74) *Attorney, Agent, or Firm* — Pillsbury Winthrop Shaw Pittman, LLP (57) ABSTRACT

A method of manufacturing a pellicle for a lithographic apparatus, the method including locally heating the pellicle using radiative heating, and depositing coating material simultaneously on both sides of the pellicle, and pellicles
(Continued)

manufactured according to this method. Also disclosed is the use of a multilayer graphene pellicle with a double-sided hexagonal boron nitride coating in a lithographic apparatus.

22 Claims, 2 Drawing Sheets

(58) Field of Classification Search
CPC ............ G03F 7/70983; G03F 7/70916; G03F 7/70908–70941; G03F 7/7095; G03F 7/70975; G03F 7/70991; C01B 32/186; G02B 5/0816; H01L 21/0275; B82Y 40/00; G03B 27/0006
USPC ..... 355/30, 52–55, 67–71, 72, 75–77; 430/5
See application file for complete search history.

(56) References Cited

U.S. PATENT DOCUMENTS

| | | | |
|---|---|---|---|
| 7,314,667 B2* | 1/2008 | Tregub | G03F 1/62 428/14 |
| 9,260,780 B2* | 2/2016 | Kusunoki | C23C 14/225 |
| 2007/0231010 A1* | 10/2007 | Ohta | G03G 15/0291 399/168 |
| 2009/0291372 A1* | 11/2009 | Kubota | G03F 1/62 430/5 |
| 2012/0248460 A1 | 10/2012 | Abraham et al. | |
| 2013/0250260 A1* | 9/2013 | Singh | G03F 1/62 355/53 |
| 2016/0258081 A1* | 9/2016 | Özyilmaz | C01B 32/188 |
| 2018/0174873 A1* | 6/2018 | Miller | C23C 14/505 |
| 2018/0364561 A1* | 12/2018 | Vles | G03F 1/22 |
| 2019/0056654 A1 | 2/2019 | Péter et al. | |

FOREIGN PATENT DOCUMENTS

| | | | |
|---|---|---|---|
| JP | S6358916 | 3/1998 | |
| JP | 2003303771 | 10/2003 | |
| JP | 2007264429 | 10/2007 | |
| JP | 2011211175 | 10/2011 | |
| TW | 201405636 | 2/2014 | |
| TW | 201725178 | 7/2017 | |
| WO | WO-2012049428 A2 * | 4/2012 | ............ B05D 1/12 |
| WO | 2017067813 | 4/2017 | |
| WO | 2017102380 | 6/2017 | |

OTHER PUBLICATIONS

International Search Report and Written Opinion issued in corresponding PCT Patent Application No. PCT/EP2018/067052, dated Nov. 12, 2018.
Yang, Wei et al.: "Epitaxial growth of single-domain graphene on hexagonal boron nitride", Nature Materials, vol. 12, pp. 792-797, Jul. 14, 2013.
Cho, Yong-Jin et al.: "Hexagonal Boron Nitride Tunnel Barriers Grown on Graphite by High Temperature Molecular Beam Epitaxy", Scientific Reports, 6:34474, Sep. 29, 2016.
Liu, Zheng et al.: "Ultrathin high-temperature oxidation-resistant coatings of hexagonal boron nitride", Nature Communications, 4:2541, Oct. 4, 2013.
Bonaccorso, Francesco et al.: "Production and processing of graphene and 2d crystals", Materials Today, vol. 15, No. 12, Dec. 2012.
Japanese Office Action issued in corresponding Japanese Patent Application No. 2020-500720, dated Apr. 22, 2022.
Office Action issued in Korean Patent Application No. 10-2020-7003067, dated Oct. 12, 2023.
Office Action issued in corresponding Korean Patent Application No. 20207003067, dated Jan. 18, 2024.

* cited by examiner

SIMULTANEOUS DOUBLE-SIDE COATING OF MULTILAYER GRAPHENE PELLICLE BY LOCAL THERMAL PROCESSING

CROSS-REFERENCE TO RELATED APPLICATIONS

This application is the U.S. national phase entry of PCT Patent Application No. PCT/EP2018/067052, which was filed on Jun. 26, 2018, which claims the benefit of priority of European Patent Application No. 17184701.5, which was filed on Aug. 3, 2017, and which is incorporated herein in its entirety by reference.

FIELD

The present invention relates to a method of manufacturing a pellicle for a lithographic apparatus, a pellicle for a lithographic apparatus, and a lithographic apparatus comprising a pellicle, as well as uses therefor.

BACKGROUND

A lithographic apparatus is a machine constructed to apply a desired pattern onto a substrate. A lithographic apparatus can be used, for example, in the manufacture of integrated circuits (ICs). A lithographic apparatus may for example project a pattern from a patterning device (e.g. a mask) onto a layer of radiation-sensitive material (resist) provided on a substrate.

The wavelength of radiation used by a lithographic apparatus to project a pattern onto a substrate determines the minimum size of features which can be formed on that substrate. A lithographic apparatus which uses EUV radiation, being electromagnetic radiation having a wavelength within the range 4-20 nm, may be used to form smaller features on a substrate than a conventional lithographic apparatus (which may for example use electromagnetic radiation with a wavelength of 193 nm).

A lithographic apparatus includes a patterning device (e.g. a mask or reticle). Radiation is provided through or reflected off the patterning device to form an image on a substrate. A pellicle may be provided to protect the patterning device from airborne particles and other forms of contamination. Contamination on the surface of the patterning device can cause manufacturing defects on the substrate.

Pellicles may also be provided for protecting optical components other than patterning devices. Pellicles may also be used to provide a passage for lithographic radiation between regions of the lithography apparatus which are sealed from one another. Pellicles may also be used as filters, such as spectral purity filters.

Known pellicles may comprise, for example, a freestanding graphene membrane, graphene derivative, including graphene halides, graphane, fullerene, carbon nanotube, or other carbon-based material. A mask assembly may include the pellicle which protects a patterning device (e.g. a mask) from particle contamination. The pellicle may be supported by a pellicle frame, forming a pellicle assembly. The pellicle may be attached to the frame, for example, by gluing a pellicle border region to the frame. The frame may be permanently or releasably attached to a patterning device. The freestanding graphene membrane may be formed by floating a thin film of graphene on a liquid surface and scooping the thin film onto a silicon frame, or via back etching. The quality of membranes formed in this way has been found to be variable and difficult to control. Furthermore, it is difficult to produce large graphene membranes reliably.

It has been found that the lifetime of known pellicles, such as pellicles comprising freestanding graphene membranes or other carbon-based membranes, is limited.

It has also been found that known pellicles may be etched in an atmosphere which contains free radical species, such as H* and HO*, and thereby can degrade over time with use. Since pellicles are very thin, the reaction with the free radical species can weaken the pellicle and ultimately cause it to fail.

Ways to improve the performance and resilience of pellicles, such as graphene pellicles, whilst retaining the desirable physical characteristics of the pellicle material have been investigated. This may be achieved by growing a chemically- and/or thermally-resistant layer on one side of the pellicle. One option is to grow a layer of hexagonal boron nitride (h-BN) on one face of the graphene. Graphene and hexagonal boron nitride are complementary two-dimensional materials which are structurally very similar. Hexagonal boron nitride has a low dielectric constant, high temperature stability, and high thermal conductivity. It is also chemically stable and is able to resist etching caused by free radical species.

Graphene and hexagonal boron nitride layers can be independently grown via known chemical vapour deposition techniques, and it is possible to directly grow a h-BN layer onto one side of a graphene sheet. The conditions used in chemical vapour deposition are well known in the art.

In one method of producing graphene, a support surface comprising copper foil (25 microns thickness) is prepared by washing with diluted nitric acid ($HNO_3$:$H_2O$ in a 1:3 ratio) and deionized water in order to remove the surface oxidised layer. The cleaned copper support surface is loaded into a quartz tube and the temperature is raised to around 950° C. with 500 mT Ar/$H_2$ gas flow (15 vol % $H_2$ balanced by 85 vol % Ar) to avoid oxidation of the copper. When the temperature reaches 950° C., the argon and hydrogen gas is cut off and 150 mTorr n-hexane vapour is introduced for around 10 minutes. A fast annealing process is then carried out at a rate of 50° C./min under the protection of 500 mT Ar/$H_2$. The copper support comprising the graphene layer is then transferred to a furnace to grow the h-BN layer. The samples are annealed at 800° C. for 20 minutes in 800 mT Ar/$H_2$ flow. The furnace is then heated to around 1000° C. for 20 minutes. Precursor ammonia borane ($NH_3$—$BH_3$) is sublimated at 130° C. by using a heating belt and then carried to the reaction region by Ar/$H_2$ gas flow. During the growth of the h-BN, the Ar/$H_2$ gas is held at around 400 mT. The typical growth time is around 10 to around 30 minutes. After growth, the furnace is cooled down to room temperature quickly.

In order for the graphene layers to be used as pellicles, it is necessary to remove the graphene layers from the support surface on which they are grown. Removing the graphene layers from the support surface is difficult and inevitably leads to damage to the graphene. Thus, graphene comprising a layer of h-BN formed in this way is unsuitable for use as a pellicle. In addition, the graphene membrane might collapse with increasing temperature due to the mismatch of the coefficients of thermal expansion of the graphene and the support surface. Similar considerations apply to pellicles made of materials other than graphene.

Due to the difficulty and resulting damage to the pellicle, it is not possible to coat one side of a graphene layer with h-BN by attaching it to a support surface, such as copper, subsequently remove the graphene from the support surface, turn the graphene over, reattach it to another support surface, and then deposit a h-BN layer on the other side of the graphene.

In a method of providing a h-BN layer on a graphene film, the graphene film may held in place in a frame. The frame is attached to a heating plate, such that the heating plate heats up the frame, which in turn heats up the graphene, namely, the graphene is heated primarily by conduction of heat from the frame. As such, the whole apparatus including the frame and pellicle need to be heated up to the temperature at which chemical vapour deposition takes place, around 1000° C. Since the graphene and frame have different coefficients of expansion, as the temperature increases and decreases, the different extents to which the graphene and frame expand and contract result in strain on the graphene, which results in failure of the graphene. Thus, there is no current acceptable way of manufacturing a graphene pellicle for a lithographic apparatus in which the graphene pellicle comprises at least one layer of h-BN on both sides of the pellicle. Similarly, there is no current advantageous way of manufacturing a pellicle having a relatively large surface area for lithographic apparatus in which the pellicle comprises at least one coating material on both sides of the pellicle.

It is therefore desirable to provide a method for simultaneously depositing a coating material on both sides of a pellicle. It is also desirable to provide a pellicle comprising a coating material on both side of the pellicle. In particular, it is desirable to provide a method for simultaneously forming a h-BN layer on both sides of a graphene pellicle. It is also desirable to provide an h-BN coated graphene pellicle which comprises a h-BN coating on both sides of the graphene.

The term "graphene" or "graphene derivatives" may comprise a single layer (a sheet) as well as multiple layers, such as up to 20 layers of graphene. The thinner the pellicle film, the higher the EUV radiation transmission will be.

Whilst the present application generally refers to pellicles in the context of lithography apparatus, in particular EUV lithography apparatus, the invention is not limited to only pellicles and lithography apparatus and it is appreciated that the subject matter of the present invention may be used in any other suitable apparatus or circumstances.

For example, the methods of the present invention may equally be applied to spectral purity filters. Practical EUV sources, such as those which generate EUV radiation using a plasma, do not only emit desired 'in-band' EUV radiation, but also undesirable (out-of-band) radiation. This out-of-band radiation is most notably in the deep UV (DUV) radiation range (100 to 400 nm). Moreover, in the case of some EUV sources, for example laser produced plasma EUV sources, the radiation from the laser, usually at 10.6 microns, presents a significant out-of-band radiation.

In a lithographic apparatus, spectral purity is desired for several reasons. One reason is that resist is sensitive to out of-band wavelengths of radiation, and thus the image quality of patterns applied to the resist may be deteriorated if the resist is exposed to such out-of-band radiation. Furthermore, out-of-band radiation infrared radiation, for example the 10.6 micron radiation in some laser produced plasma sources, leads to unwanted and unnecessary heating of the patterning device, substrate, and optics within the lithographic apparatus. Such heating may lead to damage of these elements, degradation in their lifetime, and/or defects or distortions in patterns projected onto and applied to a resist-coated substrate.

A typical spectral purity filter may be formed, for example, from a silicon membrane that is coated with a reflective metal, such as molybdenum or Ru. In use, a typical spectral purity filter might be subjected to a high heat load from, for example, incident infrared and EUV radiation. The heat load might result in the temperature of the spectral purity filter being above 800° C., which results in eventual delamination of the coating. Delamination and degradation of the silicon membrane is accelerated by the presence of hydrogen, which is often used as a gas in the environment in which the spectral purity filter is used in order to suppress debris (e.g. molecular outgassing from resists, or particles debris or the like), from entering or leaving certain parts of the lithographic apparatus. Thus, the spectral purity filter may be used as a pellicle, and vice versa. Therefore, reference in the present application to a 'pellicle' is also reference to a 'spectral purity filter'. Although reference is primarily made to pellicles in the present application, all of the features could equally be applied to spectral purity filters.

In a lithographic apparatus (and/or method) it is desirable to minimise the losses in intensity of radiation which is being used to apply a pattern to a resist coated substrate. One reason for this is that, ideally, as much radiation as possible should be available for applying a pattern to a substrate, for instance to reduce the exposure time and increase throughput. At the same time, it is desirable to minimise the amount of undesirable radiation (e.g. out-of-band) radiation that is passing through the lithographic apparatus and which is incident upon the substrate. Furthermore, it is desirable to ensure that a spectral purity filter used in a lithographic method or apparatus has an adequate lifetime, and does not degrade rapidly over time as a consequence of the high heat load to which the spectral purity filter may be exposed, and/or the hydrogen (or the like, such as free radical species including H* and HO*) to which the spectral purity filter may be exposed. It is therefore desirable to provide an improved (or alternative) spectral purity filter, and for example a spectral purity filter suitable for use in a lithographic apparatus and/or method.

Furthermore, whilst the present application generally refers to graphene pellicles, it will be appreciated that any suitable pellicle material may be used. For example, the pellicle may comprise any suitable carbon-based material, including graphane, graphene halides, fullerene, carbon nanotubes, metals, and metal silicides, such as molybdenum disilicide or zirconium disilicide. It will also be appreciated that any suitable coating material may be used, with hexagonal boron nitride provided as a specific example.

SUMMARY

The present invention has been made in consideration of the aforementioned problems with known methods of growing coating materials on pellicles, in particular growing h-BN on graphene pellicles.

According to a first aspect of the present invention, there is provided a method of manufacturing a pellicle for a lithographic apparatus, said method comprising: locally heating the pellicle using radiative heating and depositing a coating material simultaneously on both sides of the pellicle.

In so-called Cold Wall Chemical Vapour Deposition (CVD), the substrate onto which the deposition is to take place is heated directly by induction, passing a current through the substrate itself, or by a heater in direct thermal contact with the substrate. In this way, the entire contents of the chemical vapour deposition chamber are heated up to the required temperature. However, the different coefficients of expansion of the frame and the graphene pellicle or the graphene pellicle and the support substrate result in differences in the amount the frame or support substrate and graphene pellicle expand, which results in strain on the graphene pellicle, and ultimately damage to the graphene pellicle. In addition, as described above, the graphene will be damaged when it is removed from the support surface, rendering it unsuitable for use as a pellicle.

In Hot Wall CVD, the chamber is heated by an external power source and the substrate is heated by radiation from the chamber walls. In Hot Wall CVD, there is no means for directing the radiation and the walls radiate the thermal energy in all directions. As such, the entire contents of the chamber is heated up to the required temperature, which can result in damage to the pellicle on account of the different thermal expansion coefficients of the pellicle and the frame on which the pellicle is supported.

In the present invention, by locally heating the pellicle using radiative heating, it has been surprisingly found that it is possible to simultaneously coat both sides of a pellicle with a coating material. Since both sides of the pellicle are coated simultaneously, the number of processing steps is reduced and the pellicle material is not damaged, and thus rendered unusable as a pellicle, by removing it from a support surface. In addition, it has been surprisingly found that radiative heating causes the pellicle material to heat up to the required temperature for the coating material to be deposited whilst the frame on which the pellicle is supported heats up to a lesser degree. This means that the frame expands less than that observed when other types of heating are used and therefore the pellicle is not damaged. Without wishing to be bound by scientific theory, it is believed that the significantly lower thermal mass of the thin pellicle compared to the thermal mass of the frame causes the pellicle to heat up much more rapidly than the frame. In addition, the rate at which the frame rejects heat at a given temperature is higher than the rate at which the pellicle rejects heats. Thus, even if the system were left to reach a steady state, the frame would reach an equilibrium temperature significantly below the equilibrium temperature of the pellicle due to the different rates at which heat is rejected by the pellicle and by the frame. As such, the frame would expand to a lesser degree than it would with other heating methods and therefore the strain on the pellicle is reduced. This allows the pellicle to be simultaneously coated on both sides with a coating material, such as h-BN. Coating the pellicle with a coating material on both sides simultaneously may also allow for any stresses generated in the pellicle by the coating process to be balanced between both faces of the pellicle. Where one side of the pellicle is coated at a time, this may result in an imbalance of forces in the pellicle, which could lead to damage or poor performance. There is no realization of this in the art.

The pellicle may comprise any suitable material. Preferably, the pellicle material comprises at least one of graphene, graphane, graphene halide, fullerene, carbon nanotubes, metals, and metal silicides, such as molybdenum disilicide or zirconium disilicide. Most preferably, the pellicle is a graphene pellicle.

The coating material may comprise any suitable material which is chemically and/or thermally stable at the operating conditions in a lithographic apparatus. Preferably, the coating material is at least one of hexagonal boron nitride, graphene, and graphene derivatives. Most preferably, the coating material is hexagonal boron nitride.

Any suitable combination of pellicle and coating material may be used. For example a graphene, a graphene derivative or hexagonal boron nitride coating may be grown on a metal or metal silicide pellicle. The coating material is generally different from the material of the pellicle film.

The radiative heating may be provided by any suitable means and is preferably provided by a laser and/or an infrared lamp. The power of the laser and/or infrared lamp can be selected to heat the pellicle to the temperature required for the coating material, such as h-BN, to be deposited on the pellicle.

Preferably, the local heating is provided by directing the radiative heating onto the surface of the pellicle, which may be a graphene pellicle. The light from the laser and/or infrared lamp may be focused substantially on the pellicle. Preferably, the light is not focused on the frame supporting the pellicle. In this way, only the pellicle is heated and the frame is not. As the frame is not heated, it does not expand and create tension in the pellicle, thereby avoiding damage to the pellicle. It will be appreciated that some of the light from the laser and/or infrared lamp may fall on the frame, but the differences in thermal mass between the frame and the pellicle as well as the rates at which they reject heat is such that the pellicle heats up to a higher temperature than the frame.

The radiative heating may be provided by a laser and/or infrared lamp located within the chamber. In such an embodiment, the chamber does not require a window through which the laser and/or infrared light may pass. In an alternative embodiment, the laser and/or infrared lamp is located outside of the chamber. In such an embodiment, the chamber comprises a window through which the laser and/or infrared light may pass into the chamber and onto the pellicle.

The pellicle is preferably supported in the chamber, preferably by a frame. By supporting the pellicle in a frame, this allows the pellicle to be held in the correct orientation in the chamber whilst also allowing the coating material to access both sides of the pellicle simultaneously. Preferably, the pellicle is supported around the periphery of the pellicle. By supporting the pellicle substantially around its periphery, this leaves the central portion of the pellicle exposed to the atmosphere within the chamber and allows the coating material layer, such as a layer of hexagonal boron nitride, to form on both sides simultaneously.

The chamber is preferably a chemical vapour deposition chamber.

The atmosphere within the chamber preferably comprises a mixture of hydrogen and argon gas. Any suitable ratio of hydrogen to argon gas may be used as is known in the art. Similarly, any suitable pressure and flow rate as known in the art may be used. The ratio of hydrogen to argon can be modified as required. The hydrogen is included in order to react with any oxygen in the atmosphere within the chamber to protect the pellicle from oxidation. The argon is included in order to provide an inert atmosphere. Argon is preferably used as it is cheaper than other noble gases, although other noble gases or inert gases could be used.

Preferably a coating material source comprising boron and nitrogen is provided. The coating material source comprising boron and nitrogen is preferably ammonia borane. Ammonia borane is preferably heated to cause it to sublime and the gaseous ammonia borane is able to diffuse into the atmosphere surrounding the graphene pellicle. As the ammonia borane comes into contact with the heated graphene pellicle, it will break down to form the h-BN layer. The ammonia borane source may be located within the chamber or may be located separately from the chamber with the gaseous ammonia borane being passed into the chamber by any suitable means, such as a pipe. Preferably, the pellicle is a multi-layer graphene pellicle, although a single layer graphene pellicle could be used. It will be appreciated that the coating material source provided will depend on the nature of the coating material being applied. For example, where the coating layer is graphene or graphene derivative, the coating material source may comprise any suitable carbon source. In addition, the coating material source may be heated to cause it to sublime, boil, evaporate, and/or decomposes, or otherwise be entrained in the environment surrounding the pellicle.

According to a second aspect of the present invention, there is provided a pellicle for a lithographic apparatus obtainable or obtained by the method according to the first aspect of the present invention.

Due to the limitations of known methods for producing pellicles, until now, there has been no suitable way of making a pellicle having both sides coated with a coating material, especially a pellicle suitable for use in a lithographic apparatus. In particular, there has been no suitable way until now of making a graphene pellicle having both sides coated with h-BN, especially where the coating is deposited simultaneously on both sides of the pellicle.

According to a third aspect of the present invention, there is provided a pellicle for a lithographic apparatus, said pellicle comprising at least one graphene layer coated with at least one hexagonal boron nitride layer on each side of the at least one graphene layer.

As mentioned above, it has not previously been possible to coat a graphene pellicle on both sides with a hexagonal boron nitride layer. In particular, it has only previously been possible to coat one side of a graphene pellicle with hexagonal boron nitride. Even then, it has not proven possible to reliably use a graphene sample coated on a single side with h-BN as a pellicle due to the difficulties in removing the graphene layer from the support layer. In addition, even it if was attempted to coat both sides of a graphene sheet with h-BN, known techniques cause damage to the graphene with the result that it would could not be used as a pellicle. Similar difficulties are faced with pellicle comprising materials other than graphene.

By coating a graphene pellicle on both sides with h-BN, the graphene is protected from attack by free radical species and therefore the lifetime of the pellicle is extended. In addition, coating both sides of the graphene with h-BN provides a mechanical strength enhancement of the graphene pellicle. Without wishing to be bound by scientific theory, it is believed that the lattice match between the graphene and h-BN results in a strength enhancement.

Preferably, the at least one hexagonal boron nitride layers on each side of the at least one graphene layer are applied to the at least one graphene layer simultaneously.

The simultaneous application of h-BN to both sides of the graphene pellicle allows h-BN to be applied to both sides of the graphene layer without breakage of the graphene layer. In the prior art, it is only known to coat one side of a graphene layer with h-BN. This results in one side of the graphene being susceptible to etching by free radicals. In addition, graphene which is coated with h-BN on a single side is mechanically weaker than graphene which is coated on both sides with h-BN.

It will be appreciated that the graphene may be one or more layers thick. Similarly, it will also be appreciated that the h-BN may be one or more layers thick.

According to a fourth aspect of the present invention, there is provided the use of a pellicle manufactured by the method according to the first aspect of the present invention or a pellicle according to the second or third aspects of the present invention in a lithographic apparatus.

Since it has not been possible to manufacture a graphene pellicle comprising h-BN on both sides of the graphene layer, it has not been possible to use such a pellicle in a lithographic apparatus.

According to a fifth aspect of the present invention, there is provided the use of chemical vapour deposition (CVD) to manufacture a pellicle according to the second or third aspects of the present invention.

Preferably, the CVD is laser CVD, which utilizes light to heat up the substrate which is to be coated.

According to a sixth aspect of the present invention, there is provided an assembly for a lithographic apparatus comprising a pellicle according to the first or third aspects of the present invention, a frame for supporting the pellicle and a patterning device attached to the frame.

In summary, the methods of the present invention allow for the manufacture of a pellicle, in particular a graphene pellicle, comprising a coating material, such as h-BN, on either side of the pellicle. The resulting pellicle is suitable for use in lithographic apparatus, such as, for example, and EUV lithography apparatus. It has not been previously possible to manufacture such a pellicle. The pellicles manufactured according to the methods of the present invention are able to resist the high temperatures achieved when the pellicle is in use and also resist attack by free radical species or other reactive species on account of the layer of coating material on either side of the pellicle.

The present invention will now be described with reference to a graphene pellicle on which a layer of h-BN is simultaneously deposited on each side of the pellicle. However, it will be appreciated that the present invention is not limited to pellicles and is equally applicable to spectral purity filters, as well as to core materials other than graphene, and coating materials other than h-BN.

BRIEF DESCRIPTION OF THE DRAWINGS

Embodiments of the invention will now be described, by way of example only, with reference to the accompanying schematic drawings, in which.

DETAILED DESCRIPTION

Figure 1:
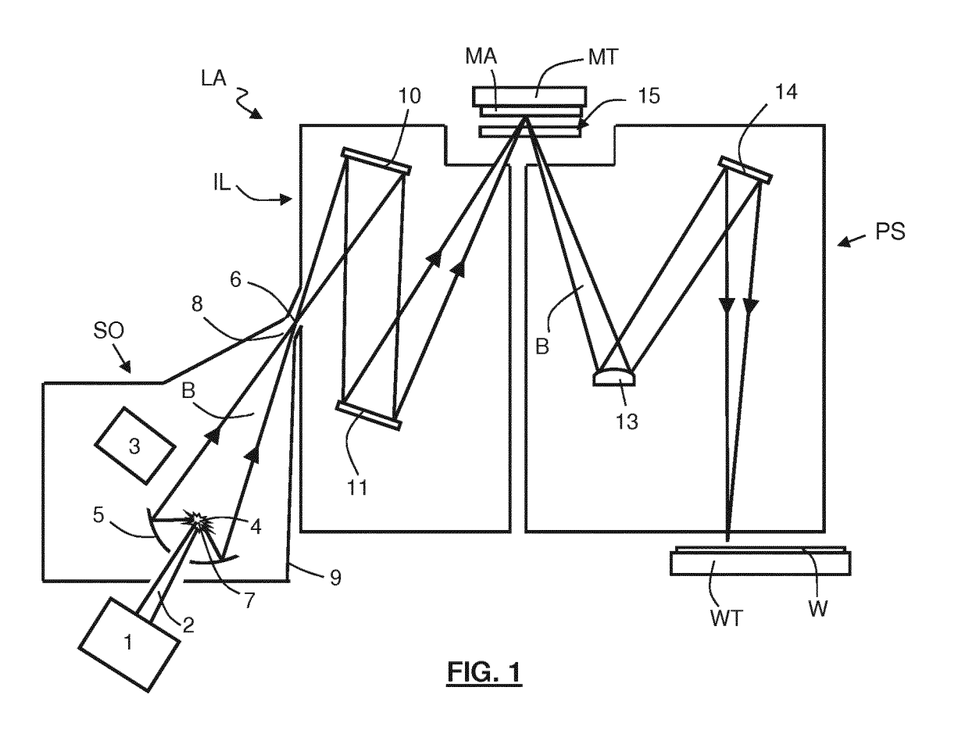
FIG. 1 depicts a lithographic system comprising a lithographic apparatus and a radiation source according to an embodiment of the invention.

FIG. 1 shows a lithographic system including a pellicle 15 according to the second and third aspects of the present invention or manufactured according to the methods of the first aspect of the present invention according to one embodiment of the invention. The lithographic system comprises a radiation source SO and a lithographic apparatus LA. The radiation source SO is configured to generate an extreme ultraviolet (EUV) radiation beam B. The lithographic apparatus LA comprises an illumination system IL, a support structure MT configured to support a patterning device MA (e.g. a mask), a projection system PS and a substrate table WT configured to support a substrate W. The illumination system IL is configured to condition the radiation beam B before it is incident upon the patterning device MA. The projection system is configured to project the radiation beam B (now patterned by the mask MA) onto the substrate W. The substrate W may include previously formed patterns. Where this is the case, the lithographic apparatus aligns the patterned radiation beam B with a pattern previously formed on the substrate W. In this embodiment, the pellicle 15 is depicted in the path of the radiation and protecting the patterning device MA. It will be appreciated that the pellicle 15 may be located in any required position and may be used to protect any of the mirrors in the lithographic apparatus.

The radiation source SO, illumination system IL, and projection system PS may all be constructed and arranged such that they can be isolated from the external environment. A gas at a pressure below atmospheric pressure (e.g. hydrogen) may be provided in the radiation source SO. A vacuum may be provided in illumination system IL and/or the projection system PS. A small amount of gas (e.g. hydrogen) at a pressure well below atmospheric pressure may be provided in the illumination system IL and/or the projection system PS.

The radiation source SO shown in FIG. 1 is of a type which may be referred to as a laser produced plasma (LPP) source). A laser 1, which may for example be a $CO_2$ laser, is arranged to deposit energy via a laser beam 2 into a fuel, such as tin (Sn) which is provided from a fuel emitter 3. Although tin is referred to in the following description, any suitable fuel may be used. The fuel may for example be in liquid form, and may for example be a metal or alloy. The fuel emitter 3 may comprise a nozzle configured to direct tin, e.g. in the form of droplets, along a trajectory towards a plasma formation region 4. The laser beam 2 is incident upon the tin at the plasma formation region 4. The deposition of laser energy into the tin creates a plasma 7 at the plasma formation region 4. Radiation, including EUV radiation, is emitted from the plasma 7 during de-excitation and recombination of ions of the plasma.

The EUV radiation is collected and focused by a near normal incidence radiation collector 5 (sometimes referred to more generally as a normal incidence radiation collector). The collector 5 may have a multilayer structure which is arranged to reflect EUV radiation (e.g. EUV radiation having a desired wavelength such as 13.5 nm). The collector 5 may have an elliptical configuration, having two ellipse focal points. A first focal point may be at the plasma formation region 4, and a second focal point may be at an intermediate focus 6, as discussed below.

The laser 1 may be separated from the radiation source SO. Where this is the case, the laser beam 2 may be passed from the laser 1 to the radiation source SO with the aid of a beam delivery system (not shown) comprising, for example, suitable directing mirrors and/or a beam expander, and/or other optics. The laser 1 and the radiation source SO may together be considered to be a radiation system.

Radiation that is reflected by the collector 5 forms a radiation beam B. The radiation beam B is focused at point 6 to form an image of the plasma formation region 4, which acts as a virtual radiation source for the illumination system IL. The point 6 at which the radiation beam B is focused may be referred to as the intermediate focus. The radiation source SO is arranged such that the intermediate focus 6 is located at or near to an opening 8 in an enclosing structure 9 of the radiation source.

The radiation beam B passes from the radiation source SO into the illumination system IL, which is configured to condition the radiation beam. The illumination system IL may include a facetted field mirror device 10 and a facetted pupil mirror device 11. The faceted field mirror device 10 and faceted pupil mirror device 11 together provide the radiation beam B with a desired cross-sectional shape and a desired angular distribution. The radiation beam B passes from the illumination system IL and is incident upon the patterning device MA held by the support structure MT. The patterning device MA reflects and patterns the radiation beam B. The illumination system IL may include other mirrors or devices in addition to or instead of the faceted field mirror device 10 and faceted pupil mirror device 11.

Following reflection from the patterning device MA the patterned radiation beam B enters the projection system PS. The projection system comprises a plurality of mirrors 13, 14 which are configured to project the radiation beam B onto a substrate W held by the substrate table WT. The projection system PS may apply a reduction factor to the radiation beam, forming an image with features that are smaller than corresponding features on the patterning device MA. A reduction factor of 4 may for example be applied. Although the projection system PS has two mirrors 13, 14 in FIG. 1, the projection system may include any number of mirrors (e.g. six mirrors).

The radiation sources SO shown in FIG. 1 may include components which are not illustrated. For example, a spectral filter may be provided in the radiation source. The spectral filter may be substantially transmissive for EUV radiation but substantially blocking for other wavelengths of radiation such as infrared radiation. Indeed, the spectral filter may be a pellicle according to any aspect of the present invention.

Figure 2:
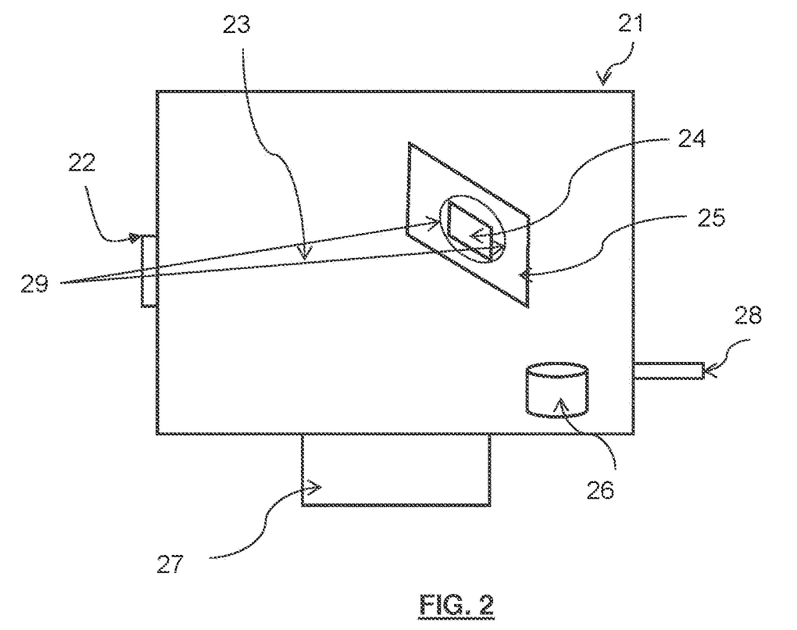
FIG. 2 depicts a schematic view of a Chemical Vapour Deposition chamber in which the methods of the present invention may be operated and in which the pellicles of the present invention may be formed.

FIG. 2 shows a schematic depiction of a CVD chamber 21. In this embodiment, laser or infrared lamp 29 is located outside the chamber 21. The chamber 21 comprises a window 22 which allows light 23 from the laser or infrared lamp 29 to pass into the chamber 21 and fall onto the pellicle 24. The pellicle 24 is supported in place by frame 25. The light 23 is preferably focused on the pellicle 24. Within the chamber is a crucible 26 containing the material which is to coat the pellicle 24. The crucible 26 may comprise any suitable container for holding the coating material, which is preferably ammonia borane, and there are heating means (not shown) for heating the ammonia borane and causing it to sublime. The apparatus further comprises a gas connection 28 through which a mixture of hydrogen and argon gas may be passed into the chamber 21. There is also provided a pump 27 for removing air or other gases from the chamber 21.

In use, the graphene pellicle 24 is supported on the frame 25 within chamber 21. The chamber is sealed and the air is removed from the chamber 21 by way of pump 27. A mixture of hydrogen and argon is pumped into the chamber 21 via gas connection 28. The ammonia borane in the crucible 26 is heated to a temperature at which it sublimes. In this way, the atmosphere within the chamber 21 comprises gaseous ammonia borane. The radiative heat source 29 is shone onto the pellicle 24 in order to heat the pellicle 24 to a temperature at which the ammonia borane will be broken down and deposited as a layer of h-BN on the surface of the pellicle 24. As the gaseous ammonia borane breaks down, it simultaneously forms a layer of h-BN on both sides of the pellicle 24. The temperature of the frame 25 may not be sufficient to result in a layer of h-BN to form.

In an embodiment, there is provided a method of manufacturing a pellicle for a lithographic apparatus, the method comprising: locally heating the pellicle using radiative heating, and depositing a, coating material simultaneously on both sides of the pellicle.

In an embodiment, the pellicle comprises at least one selected from: graphene, graphane, graphene derivative, graphene halide, fullerene, carbon nanotubes, metals, and metal silicides, including molybdenum disilicide or zirconium disilicide. In an embodiment, the pellicle is a graphene pellicle. In an embodiment, the coating material is at least one of hexagonal boron nitride, graphene, and graphene derivative. In an embodiment, the radiative heating is provided by a laser and/or an infrared lamp. In an embodiment, the radiative heating is provided by a laser and/or infrared lamp provided inside a chamber. In an embodiment, the radiative heating is provided by a laser and/or infrared lamp provided outside a chamber and the chamber comprises a transparent window to allow laser light and/or infrared light to pass into the chamber and onto the pellicle. In an embodiment, the local heating is provided by directing the radiative heating onto the surface of the pellicle. In an embodiment, the pellicle is supported in the chamber, preferably by a frame. In an embodiment, the method comprises supporting the pellicle around the periphery of the pellicle. In an embodiment, the chamber is a chemical vapour deposition chamber. In an embodiment, the atmosphere within a or the chamber comprises a mixture of hydrogen and argon gas. In an embodiment, a coating material source is provided. In an embodiment, the coating material source comprises boron and nitrogen, preferably wherein the coating material source is ammonia borane, or wherein the coating material source comprises carbon. In an embodiment, the method comprises heating the coating material source to cause it to sublime, evaporate, boil, and/or decompose.

In an embodiment, there is provided a pellicle for a lithographic apparatus obtainable or obtained by a method as described herein.

In an embodiment, there is provided a pellicle for a lithographic apparatus, said pellicle comprising at least one graphene layer coated with at least one hexagonal boron nitride layer on each side of the at least one graphene layer.

In an embodiment, there is provided an assembly for a lithographic apparatus comprising a pellicle as described herein, a frame for supporting the pellicle and a patterning device attached to the frame.

In an embodiment, there is provided use of a pellicle manufactured by a method as described herein in a lithographic apparatus.

In an embodiment, there is provided use of chemical vapour deposition to manufacture a pellicle as described herein.

The term "EUV radiation" may be considered to encompass electromagnetic radiation having a wavelength within the range of 4-20 nm, for example within the range of 13-14 nm. EUV radiation may have a wavelength of less than 10 nm, for example within the range of 4-10 nm such as 6.7 nm or 6.8 nm.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A method of manufacturing a pellicle for a lithographic apparatus, the method comprising:
   locally heating the pellicle using radiative heating, the pellicle, when being heated, is freestanding and is substantially transmissive for EUV radiation, and
   depositing a coating material simultaneously on both sides of the pellicle.

2. The method according to claim 1, wherein the pellicle comprises at least one selected from: graphene, graphane, graphene derivative, graphene halide, fullerene, carbon nanotubes, metals, and/or a metal silicide, including molybdenum disilicide or zirconium disilicide.

3. The method according to claim 2, wherein the pellicle is a graphene pellicle.

4. The method according to claim 1, wherein the coating material is at least one selected from: hexagonal boron nitride, graphene, and/or graphene derivative.

5. The method according to claim 1, wherein the radiative heating is provided by a laser and/or an infrared lamp.

6. The method according to claim 1, wherein the radiative heating is provided by a laser and/or infrared lamp provided inside a chamber.

7. The method according to claim 1, wherein the radiative heating is provided by a laser and/or infrared lamp provided outside a chamber and the chamber comprises a transparent window to allow laser light and/or infrared light to pass into the chamber and onto the pellicle.

8. The method according to claim 1, wherein the local heating is provided by directing the radiative heating onto the surface of the pellicle.

9. The method according to claim 1, wherein the pellicle is supported in a chamber.

10. The method according to claim 1, further comprising supporting the pellicle around a periphery of the pellicle.

11. The method according to claim 1, wherein the pellicle is in a chamber and the chamber is a chemical vapour deposition chamber.

12. The method according to claim 1, wherein the pellicle is in a chamber and the atmosphere within the chamber comprises a mixture of hydrogen and argon gas.

13. The method according to claim 1, wherein a coating material source is provided.

14. The method according to claim 13, wherein the coating material source comprises boron and nitrogen, or wherein the coating material source comprises carbon.

15. The method according to claim 13, further comprising heating the coating material source to cause it to sublime, evaporate, boil, and/or decompose.

16. Causing radiation to interact with a pellicle manufactured by the method according to claim 1 in a lithographic apparatus.

17. A method of manufacturing a pellicle for a lithographic apparatus, the method comprising forming at least one hexagonal boron nitride layer simultaneously on each side of at least one graphene layer that, during the forming, is freestanding and substantially transmissive for EUV radiation, such that a major surface of the at least one hexagonal boron nitride layer on each side of the at least one graphene layer is exposed to an environment at the at least one graphene layer.

18. An assembly for a lithographic apparatus comprising a pellicle manufactured according to claim 17, a frame for supporting the pellicle and a patterning device attached to the frame.

19. The method according to claim 17, comprising using chemical vapour deposition to form the at least one hexagonal boron nitride layer.

20. A method of manufacturing a pellicle for a lithographic apparatus, the method comprising chemically vapor depositing at least one hexagonal boron nitride layer simultaneously on each side of at least one graphene layer that, during the depositing, is freestanding and substantially transmissive for EUV radiation.

21. An assembly for a lithographic apparatus comprising a pellicle manufactured according to claim 20, a frame for supporting the pellicle and a patterning device attached to the frame.

22. A method of manufacturing a pellicle for a lithographic apparatus, the method comprising:
- locally heating the pellicle using radiative heating, the pellicle, when being heated, is freestanding and is substantially transmissive for EUV radiation, and
- depositing a coating material simultaneously on both sides of the pellicle while the pellicle is stationary relative to the radiative heating.

\* \* \* \* \*